United States Patent
Yan et al.

(10) Patent No.: US 10,043,667 B2
(45) Date of Patent: Aug. 7, 2018

(54) INTEGRATED METHOD FOR WAFER OUTGASSING REDUCTION

(71) Applicant: Applied Materials, Inc., Santa Clara, CA (US)

(72) Inventors: Chun Yan, San Jose, CA (US); Xinyu Bao, Fremont, CA (US); Hua Chung, San Jose, CA (US); Schubert S. Chu, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/418,190

(22) Filed: Jan. 27, 2017

(65) Prior Publication Data

US 2018/0076031 A1  Mar. 15, 2018

Related U.S. Application Data

(60) Provisional application No. 62/395,212, filed on Sep. 15, 2016.

(51) Int. Cl.
*H01L 21/02* (2006.01)
*H01L 29/78* (2006.01)
(Continued)

(52) U.S. Cl.
CPC ...... *H01L 21/02664* (2013.01); *C23C 14/021* (2013.01); *C23C 14/022* (2013.01);
(Continued)

(58) Field of Classification Search
CPC ......... H01L 21/02252; H01L 21/02315; H01L 21/0234; H01L 21/76855; H01L 21/02293;
(Continued)

(56) References Cited

U.S. PATENT DOCUMENTS 5,792,700 A * 8/1998 Turner ............ H01L 21/28035
257/E21.133
7,663,121 B2  2/2010 Nowak et al.
(Continued)

FOREIGN PATENT DOCUMENTS

JP  2015-206076 A  11/2015

OTHER PUBLICATIONS

International Search Report and Written Opinion for International Application No. PCT/US2017/015348 dated Jun. 15, 2017.

*Primary Examiner* — Bac Au
(74) *Attorney, Agent, or Firm* — Patterson + Sheridan LLP (57) ABSTRACT

Implementations disclosed herein relate to methods for controlling substrate outgassing. In one implementation, the method includes removing oxides from an exposed surface of a substrate in an inductively coupled plasma chamber, forming an epitaxial layer on the exposed surface of the substrate in an epitaxial deposition chamber, and performing an outgassing control of the substrate by subjecting the substrate to a first plasma formed from a first etch precursor in the inductively coupled plasma chamber at a first chamber pressure, wherein the first etch precursor comprises a hydrogen-containing precursor, a chlorine-containing precursor, and an inert gas, and subjecting the substrate to a second plasma formed from a second etch precursor in the inductively coupled plasma chamber at a second chamber pressure that is higher than the first chamber pressure, wherein the second etch precursor comprises a hydrogen-containing precursor and an inert gas.

19 Claims, 4 Drawing Sheets

(51) Int. Cl.
*H01L 29/08* (2006.01)
*C23C 14/58* (2006.01)
*H01L 21/20* (2006.01)
*C23C 14/02* (2006.01)
*H01L 21/768* (2006.01)
*H01L 21/203* (2006.01)

(52) U.S. Cl.
CPC ...... *C23C 14/5826* (2013.01); *C23C 14/5873* (2013.01); *H01L 21/0234* (2013.01); *H01L 21/0262* (2013.01); *H01L 21/02236* (2013.01); *H01L 21/02252* (2013.01); *H01L 21/02293* (2013.01); *H01L 21/02315* (2013.01); *H01L 21/02634* (2013.01); *H01L 21/02661* (2013.01); *H01L 21/2018* (2013.01); *H01L 21/2033* (2013.01); *H01L 21/76855* (2013.01); *H01L 29/0847* (2013.01); *H01L 29/785* (2013.01)

(58) Field of Classification Search
CPC ........... H01L 21/02634; H01L 21/2018; H01L 21/2022–21/2026; H01L 21/3147; H01L 21/02236; H01L 21/0262; H01L 21/02661; H01L 21/02664; H01L 29/0847; H01L 29/785; C23C 14/58–14/5893
See application file for complete search history.

(56) References Cited

U.S. PATENT DOCUMENTS

| | | | |
|---|---|---|---|
| 7,935,940 | B1 | 5/2011 | Smargiassi |
| 8,584,612 | B2 | 11/2013 | Hart et al. |
| 2001/0004545 | A1* | 6/2001 | Drobny ............... H01L 21/8249 438/507 |
| 2003/0236003 | A1 | 12/2003 | Koo et al. |
| 2010/0216299 | A1* | 8/2010 | Poplavskyy ...... H01L 21/02422 438/502 |
| 2013/0105443 | A1 | 5/2013 | Banna et al. |
| 2013/0149462 | A1 | 6/2013 | Liang et al. |
| 2013/0288480 | A1 | 10/2013 | Sanchez et al. |
| 2014/0116335 | A1 | 5/2014 | Tsuji et al. |
| 2014/0197493 | A1 | 7/2014 | Tsai et al. |

* cited by examiner

INTEGRATED METHOD FOR WAFER OUTGASSING REDUCTION

CROSS-REFERENCE TO RELATED APPLICATIONS

This application claims priority to U.S. provisional patent application Ser. No. 62/395,212, filed Sep. 15, 2016, which is herein incorporated by reference.

BACKGROUND

Field

Implementations of the present disclosure generally relate to the fabrication of integrated circuits. More specifically, implementations disclosed herein relate to methods for controlling substrate outgassing.

Description of the Related Art

Ion implementation is a method for the introduction of chemical impurities in semiconductor substrates to form the p-n junctions necessary for field effect or bipolar transistor fabrication. Such impurities include P-type dopants, such as boron, aluminum, gallium, beryllium, magnesium, and zinc, and N-type dopants such as phosphorus, arsenic, antimony, bismuth, selenium, and tellurium. Ion implantation of chemical impurities disrupts the crystallinity of the semiconductor substrate over the range of the implant. At low energies, relatively little damage occurs to the substrate. However, the implanted dopants will not come to rest on electrically active sites in the substrate. Therefore, annealing of the substrate is required to restore the crystallinity of the substrate and drive the implanted dopants onto electrically active crystal sites.

During the processing of the substrate in, for example, an RTP chamber, the substrate may tend to outgas impurities implanted therein. These outgassed impurities may be the dopant material, a material derived from the dopant material, or any other material that may escape the substrate during the annealing process, such as the sublimation of silicon. The outgassed impurities may deposit on the colder walls and on the reflector plate of the chamber. This deposition may interfere with temperature pyrometer readings and with the radiation distribution fields on the substrate, which in turn affects the temperature at which the substrate is annealed. Deposition of the outgassed impurities may also cause unwanted particles on the substrates and may also generate slip lines on the substrate. Depending on the chemical composition of the deposits, the chamber is taken offline for a wet clean process.

Furthermore, one of the biggest challenges relates to arsenic outgassing from substrates after arsenic doped silicon processes (Si:As). In such arsenic doped silicon processes the arsenic outgassing from the substrates is higher than the arsenic outgassing from substrates after a III-V epitaxial growth process and/or an etch clean process (e.g., a CMOS, FinFET, TFET process). Previous cycle purge approaches developed for III-V epitaxial growth process and/or etch clean processes are not effective for Si:As processed substrates. Testing has been performed on the prior known III-V methods, apparatus, and results indicate that outgassing levels are not altered after ten cycles of pump/purge, as arsenic outgassing was still detected at about 2.0 parts per billion.

Absolute zero parts per billion (ppb) of outgassing is typically desired for arsenic residuals due to arsenic toxicity. To minimize toxicity from arsenic outgassing during subsequent handling and processing of substrates, there is a need for an improved method and apparatus for controlling substrate outgassing for Si:As processed substrates.

SUMMARY

Implementations disclosed herein generally relate to methods for controlling substrate outgassing such that hazardous gasses are eliminated from a surface of a substrate after a Si:As process has been performed on a substrate, and prior to additional processing. In one implementation, the method includes removing oxides from an exposed surface of a substrate in an inductively coupled plasma chamber, forming an epitaxial layer on the exposed surface of the substrate in an epitaxial deposition chamber, and performing an outgassing control of the substrate by subjecting the substrate to a first plasma formed from a first etch precursor in the inductively coupled plasma chamber at a first chamber pressure, wherein the first etch precursor comprises a hydrogen-containing precursor, a chlorine-containing precursor, and an inert gas, and subjecting the substrate to a second plasma formed from a second etch precursor in the inductively coupled plasma chamber at a second chamber pressure that is higher than the first chamber pressure, wherein the second etch precursor comprises a hydrogen-containing precursor and an inert gas.

In another implementation, the method includes removing oxides from an exposed surface of a substrate in an inductively coupled plasma chamber, forming an epitaxial layer on the exposed surface of the substrate in an epitaxial deposition chamber, and performing an outgassing control of the substrate by subjecting the substrate to a first plasma formed from a first etch precursor in the inductively coupled plasma chamber at a first chamber pressure, wherein the first etch precursor comprises a hydrogen-containing precursor, a chlorine-containing precursor, and an inert gas, and subjecting the substrate to a second plasma formed from a second etch precursor in the inductively coupled plasma chamber at a second chamber pressure that is higher than the first chamber pressure, wherein the second etch precursor comprises a hydrogen-containing precursor and an inert gas, wherein an RF bias is applied to the substrate during the outgassing control.

In yet another implementation, the method includes transferring a substrate into a substrate processing region of a plasma chamber, wherein the substrate has an exposed silicon-containing surface, removing oxides from the exposed silicon-containing surface by use of a first plasma etch process, comprising flowing a fluorine-containing precursor and an inert gas into the substrate processing region while applying a plasma power to form fluorine ions and inert gas ions, and etching the silicon-containing surface with the fluorine ions and the hydrogen-containing ions while applying a bias to the substrate to form an etched silicon-containing surface, transferring the substrate from the plasma chamber to an epitaxial deposition chamber, forming an epitaxial layer comprising arsenic on the exposed surface of the substrate, transferring the substrate from the epitaxial deposition chamber back to the plasma chamber, and performing an outgassing control of the substrate in the plasma chamber by using a first plasma formed from a first etch precursor at a first chamber pressure to remove arsenic-containing species trapped on a few top atomic layers of the substrate without significantly etching the substrate, wherein the first etch precursor comprises a hydrogen-containing precursor, a chlorine-containing precursor, and an inert gas, and using a second plasma formed from a second etch precursor at a second chamber pressure that is higher than the first chamber pressure to eliminate loosely bond arsenic species from the exposed surfaces of the substrate, wherein the second etch precursor comprises a hydrogen-containing precursor and an inert gas.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Figure 1A:
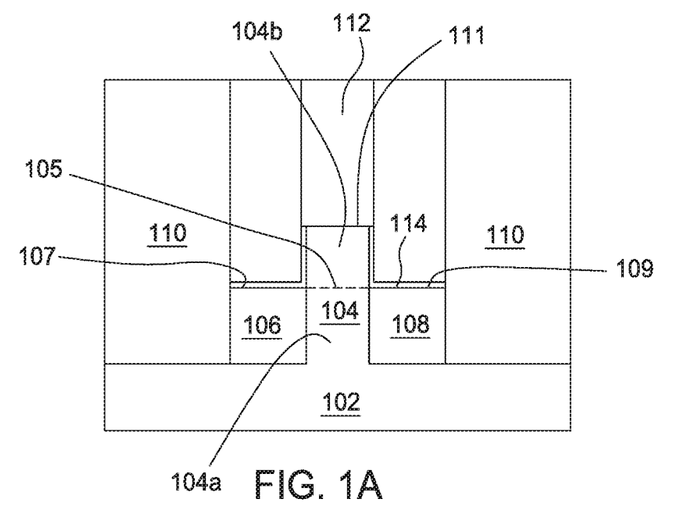
FIGS. 1A and 1B depict a cross-sectional view of a semiconductor structure that may be processed utilizing the method depicted in FIG. 2.
Figure 1B:
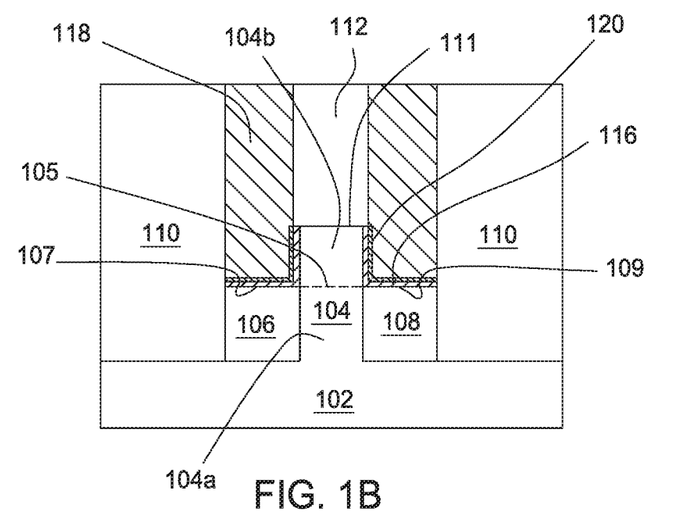
Figure 2:
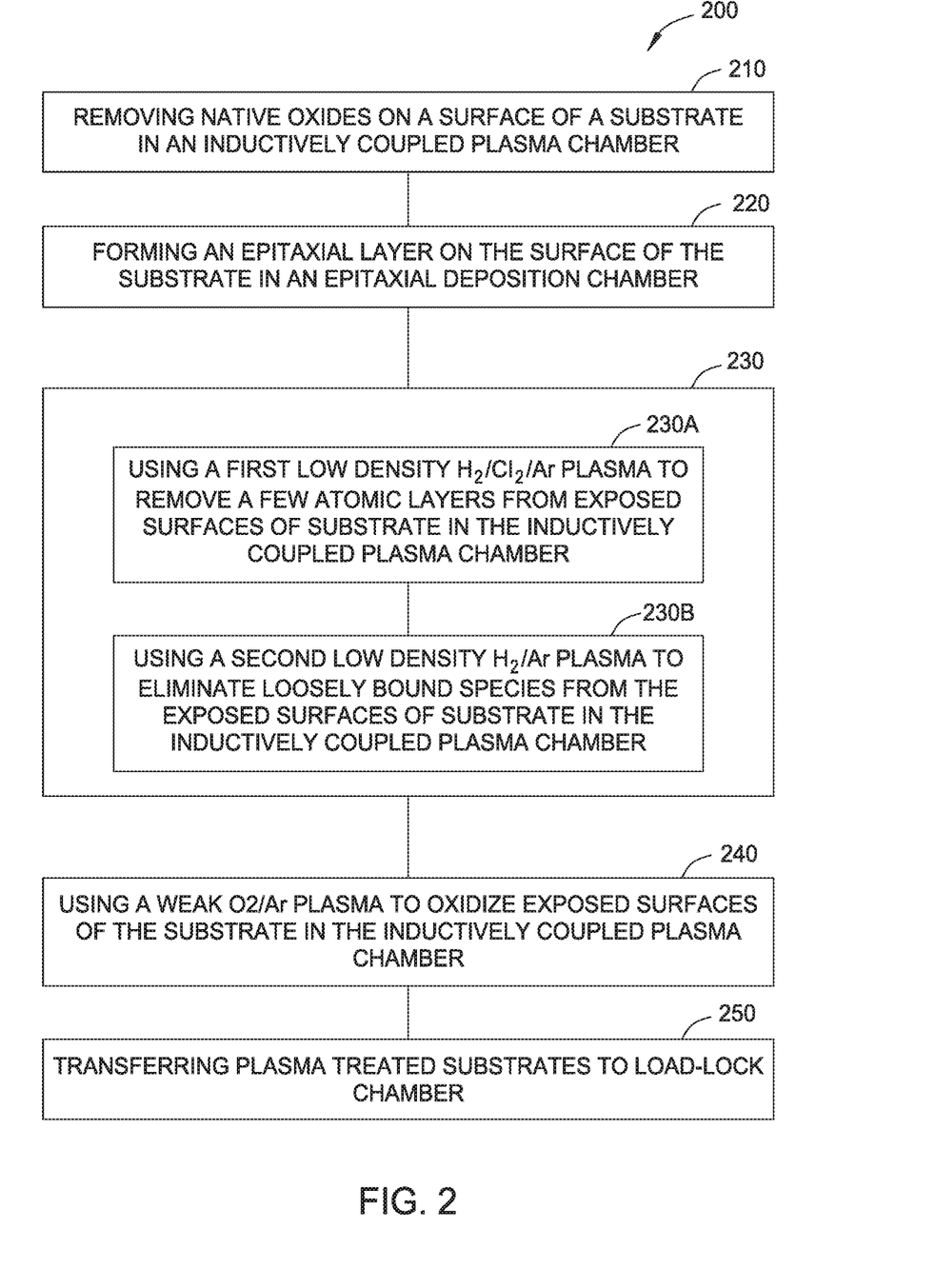
FIG. 2 illustrates a processing sequence that may be used to process the semiconductor structure of FIG. 1 in accordance with implementations of the present disclosure.

FIGS. 1A and 1B depict a cross-sectional view of a semiconductor structure 100 that may be processed utilizing the method depicted in FIG. 2. The semiconductor structure 100 forms a portion of a circuit device. In one implementation shown in FIG. 1A, the semiconductor structure 100 includes a substrate 102 and a plurality of fin structures 104 (only one is shown) extending upwardly from the substrate 102. A source region 106 and a drain region 108 are formed approximately adjacent to the fin structure 104 on opposite sides of the fin structure 104. The fin structure 104, the source region 106, and the drain region 108 are surrounded by a dielectric material 110. For PMOS transistor devices, the source region 106 and the drain region 108 are typically doped with P-type impurities, such as boron. For NMOS transistor devices, the source region 106 and the drain region 108 are typically doped with N-type impurities such as arsenic or phosphorous.

The substrate 102 may be a material such as crystalline silicon (e.g., Si<100> or Si<111>), silicon oxide, strained silicon, silicon germanium, doped or undoped polysilicon, doped or undoped silicon wafers, and patterned or non-patterned wafers silicon on insulator (SOI), carbon doped silicon oxides, silicon nitride, doped silicon, germanium, gallium arsenide, glass, and sapphire. The substrate 102 may have various dimensions, such as 200 mm or 300 mm diameter wafers, as well as, rectangular or square panels. Unless otherwise noted, implementations and examples described herein are conducted on substrates having a 300 mm diameter. In one implementation, the substrate 102 may be a crystalline silicon substrate (e.g., monocrystalline silicon or polycrystalline silicon). In the implementation shown in FIG. 1, the substrate 102 is bulk silicon or silicon-on-insulator (SOI).

The fin structure 104 may include the same or different material as the substrate 102. In the implementation as shown, the fin structure 104 and the substrate 102 are formed of the same material. The dielectric material 110 may form isolation regions, such as shallow trench isolation (STI) regions, and may include SiO, SiN, SiCN, or any suitable dielectric material.

The fin structure 104 may be employed in forming channels for FinFET transistor in later stages of manufacturing the circuit device. The fin structure 104 may include a first portion 104a and a second portion 104b that protrudes upwardly from the first portion 104a. The first portion 104a may have a first surface 105 that is coplanar with a top surface 107 of the source region 106 and a top surface 109 of the drain region 108. The second portion 104b has a second surface 111 that is at a different height relative to the top surfaces 107, 109. In some implementations, a portion of the second portion 104b may function as a source or drain region. A gate dielectric 112 (such as silicon nitrides, silicon dioxides, carbon doped silicon oxides, silicon germanium oxides, or high-k dielectric materials, etc) may be formed over the second surface 111 of the fin structure 104.

The exposed surfaces of the source region 106 and the drain region 108, for example the top surface 107 of the source region 106 and the top surface 109 of the drain region 108, are susceptible to contamination such as native oxide and/or carbon containing species when exposed to typical wafer fabrication facility ambient conditions. For example, a native oxide layer 114 may form on the top surfaces 107, 109 prior to deposition of the epitaxial layer. The presence of a native oxide layer or contaminants on the exposed surfaces of the source region 106 and the drain region 108 negatively affects the quality of an epitaxial layer subsequently formed on the top surface 107 and the top surface 109.

FIG. 2 illustrates a processing sequence 200 that may be used to process the semiconductor structure of FIG. 1 in accordance with implementations of the present disclosure. At operation 210, an oxide removal or "oxide breakthrough" process is performed. At operation 210, native oxides on a surface of a substrate, such as the substrate 102 of the semiconductor structure 100 discussed above with respect to FIG. 1A, are removed by a cleaning process.

Any suitable cleaning process that removes oxides and/or carbon containing species from the substrate without significantly damaging the substrate may be used. Suitable cleaning processes include sputter etch processes, plasma-based oxide etch processes, or combinations thereof. Exemplary plasma-based oxide etch processes include inductively coupled plasma processes. In one implementation, the cleaning process is a plasma-based oxide etch process. In one implementation, the plasma-based oxide etch process is an inductively coupled plasma process. In such a case, an inductively coupled plasma chamber, such as the plasma chamber to be discussed below with respect to FIG. 3, may be used to perform the plasma-based oxide etch process.

The surface of the substrate may include exposed surfaces, such as the top surface 107 of the source region 106 and the top surface 109 of the drain region 108 shown in FIG. 1A. The substrate may include a silicon containing material and the surface may include a material, such as silicon (Si), germanium (Ge) or silicon germanium alloys (SiGe). In some implementations, the Si, Ge, or SiGe surface may have an oxide layer, such as native oxide layer, disposed thereon. The substrate may be a semiconductor substrate with devices formed thereon.

In one implementation, the plasma-based oxide etch process involves the simultaneous exposure of a substrate to the plasma effluents of a fluorine-containing precursor and a heavy inert gas while applying a bias to the substrate. The plasma-based oxide etch process may be a capacitively coupled plasma process or an inductively couple plasma process. The plasma may be formed either in-situ or remotely.

In one implementation, the plasma-based oxide etch process includes introducing a flow of nitrogen trifluoride ($NF_3$) into a processing region. Other sources of fluorine may augment or replace the nitrogen trifluoride. In general, a fluorine-containing precursor may be flowed into the processing region and the fluorine-containing precursor comprises at least one precursor selected from the group consisting of diatomic fluorine ($F_2$), monatomic fluorine (F), nitrogen trifluoride ($NF_3$), nitrogen pentafluoride ($NF_5$), sulfur hexafluoride ($SF_6$), xenon difluoride ($XeF_2$), carbon tetrafluoride ($CF_4$), octafluorocyclobutane ($C_4F_8$), trifluoromethane ($CHF_3$), hydrogen fluoride (HF), and combinations thereof.

The plasma-based oxide etch process further includes introducing a flow of a relatively heavy inert gas into the processing region where it is simultaneously excited in a plasma along with the nitrogen trifluoride. The inert gas may be a heavy inert gas. As described herein, heavy inert gas include argon (Ar), krypton (Kr), xenon (Xe), and combinations thereof.

The plasma-based oxide etch process may involve maintenance of a gas flow ratio (heavy inert gas:fluorine-containing precursor) in order to achieve a desired etch selectivity of oxide. In one implementation, a gas flow ratio (Ar:$NF_3$) between 80:1 and 150:1 (e.g., 80:1 to 100:1; 110:1 to 130:1; 120:1) is used. Flow rates and ratios of the different gases may be adjusted to control etch rates and etch selectivity.

In certain implementations, the fluorine-containing precursor (e.g. $NF_3$) is supplied at a flow rate of between about 1 sccm (standard cubic centimeters per minute) and 25 sccm and the heavy inert gas (e.g., Ar) is supplied at a flow rate of between about 0 slm (standard liter per minute) and 4 slm. One of ordinary skill in the art would recognize that other gases and/or flows may be used depending on a number of factors including processing chamber configuration, substrate size, geometry and layout of features, and the like. The fluorine-containing precursor (e.g. $NF_3$) may be supplied at a flow rate between about 1 sccm and about 25 sccm, between about 2 sccm and about 20 sccm, between about 4 sccm and about 15 sccm or between about 5 sccm and about 12 sccm in disclosed implementations. The heavy inert gas (e.g. Ar) may be supplied at a flow between about 1 slm and about 3 slm; between about 1 slm and about 2 slm; or between about 2 slm and 3 slm.

In one implementation, the volumetric concentration of the fluorine-containing precursor (e.g., $NF_3$) in the heavy inert gas/fluorine-containing precursor mixture may be less than about 10%, or, more specifically less than about 5%, or even less than about 1%. In certain implementations, the volumetric concentration of the fluorine-containing precursor is between about 0.1% and about 10% (e.g., between about 0.1% and about 1%; or between about 1% and about 5%).

In one implementation, the volumetric concentration of the heavy inert gas (e.g., Ar) in the heavy inert gas/fluorine-containing precursor mixture may be greater than about 90%, or, more specifically greater than about 95%, or even greater than about 99%. In certain implementations, the volumetric concentration of the heavy inert gas is between about 90% and about 99.9% (e.g., between about 90% and about 95%; or between about 95% and about 99.9%).

During operation 210, the temperature of the substrate may be between about 0 degrees Celsius and about 200 degrees Celsius. In some implementations, the temperature of the substrate during the oxide removal process may be greater than or about 20 degrees Celsius, greater than or about 30 degrees Celsius, greater than or about 40 degrees Celsius, greater than or about 60 degrees Celsius, greater than or about 80 degrees Celsius or greater than or about 100 degrees Celsius. The substrate temperatures may be less than or about 120 degrees Celsius, less than or about 100 degrees Celsius, less than or about 80 degrees Celsius, less than or about 50 degrees Celsius, and may be between about 30 degrees Celsius and about 50 degrees Celsius in disclosed implementations.

Operation 210 also includes applying energy to the heavy inert gas and the fluorine-containing precursor while they are in the remote plasma region or the processing region to generate the plasma effluents. As would be appreciated by one of ordinary skill in the art, the plasma may include a number of charged and neutral species including radicals and ions. The plasma may be generated using known techniques (e.g., radio frequency excitations, capacitively coupled power, inductively coupled power, and the like). The plasma source power may be between about 10 watts and about 3,000 watts (e.g., between about 10 watts and about 1,000 watts; between about 200 watts and about 2,500 watts; between about 300 watts and about 2,000 watts; or between about 500 watts and about 1,500 watts) in implementations of the present disclosure.

During operation 210, the pressure within the substrate-processing region may be below or about 10 Torr, below or about 5 Torr, below or about 1 Torr, below or about 0.7 Torr, below or about 0.5 Torr, or below or about 0.1 Torr. The pressure may be above or about 0.5 mTorr, above or about 0.01 Torr, about 0.1 Torr, above or about 0.5 Torr, above or about 0.7 Torr or above or about 1 Torr in implementations of the present disclosure. In some implementations, the pressure in the substrate processing region may be between about 0.5 mTorr and about 700 mTorr (e.g., between about 2 mTorr and about 200 mTorr; or between about 5 mTorr and about 100 mTorr; or between about 10 mTorr and about 50 mTorr; or between about 5 mTorr and about 80 mTorr).

During operation 210, an RF bias is applied to the substrate via the substrate support with an RF power supply. Power applied to the substrate support creates a substrate bias in the form of a negative voltage on the upper surface of the substrate. This negative voltage is used to attract ions from the plasma formed in the processing region to the upper surface of the substrate. The RF bias may have a power level within a range from about 50 W to about 800 W. In one implementation, the RF bias may have a power level within a range from about 200 W to 400 W. For example, the RF bias may have a power level of 100 W, 200 W, 300 W, or 400 W. In some implementations, the frequency of the RF bias will be less than the frequency of the RF power source coupled to the coils of the chamber. For example, in some implementations, the RF bias frequency may be 2 MHz while the RF power source frequency may be 13.56 MHz. In another implementation, the RF bias frequency may be about 13.56 MHz and the RF power source frequency may be about 60 MHz.

At operation 220, the semiconductor structure 100 is transferred to an epitaxial deposition chamber to deposit an epitaxial layer on the surface of the substrate, such as exposed surfaces adjacent to the source and drain regions 106, 108, the fin structure 104, and the gate dielectric 112. Any suitable epitaxial deposition process may be used. Since the surface of the substrate is contaminant free due to the cleaning process of operation 210, the quality of the epitaxial layer subsequently formed on the surface of the substrate is improved. The epitaxial deposition may be a selective epitaxial deposition process. The epitaxial layer may be doped or undoped group IV-containing material such as Si, Ge, Si:P, SiGe, SiC, SiAs, SiGe:B, Si:CP, any suitable semiconductor materials or compound semiconductor materials.

In one implementation, the epitaxial deposition process selectively and conformally grows a first doped silicon layer 116 on exposed surfaces of the source region 106, the drain region 108, and optionally the fin structure 104, as shown in FIG. 1B. Optionally, a second doped silicon layer 118 may be grown on the first doped silicon layer 116, as shown in FIG. 1B. The first doped silicon layer 116 may be a n-type doped silicon layer, for example a silicon layer doped with arsenic (Si:As). The second doped silicon layer 118 may be a n-type doped silicon, for example a silicon layer doped with phosphorus (Si:P).

The epitaxial deposition process may be performed at a temperature that is less than 800 degrees Celsius. In this example, the temperature is set such that it will not exceed 800 degrees Celsius, in order to limit the wafer thermal budget for delicate features that may distort or diffuse if overheated. In one implementation, the epitaxial layer is deposited using a high temperature chemical vapor deposition (CVD) process. In this thermal-CVD process, processing gases such as dichlorosilane, silane, disilane, germane, phosphorus-containing gas, arsenic-containing gas, hydrogen chloride, or combinations thereof are used to deposit the epitaxial layer. The processing pressure may be between 5 and 600 Torr.

At operation 230, the semiconductor structure 100 is transferred to a plasma chamber for outgassing control. Outgassing control is a process that reduces and/or eliminates residual gas emissions, for example, arsenic, from a substrate prior to transferring the substrate for downstream processing. In various implementations of the present disclosure, the outgassing control is performed by plasma removal of species absorbed or trapped in of a few atomic layers of the substrate without significantly damaging or etching the substrate. For example, if the first doped silicon layer 116 is a silicon layer doped with arsenic (Si:As), a first plasma formed from a first chemistry may be used to remove arsenic containing species (e.g., arsines) absorbed or trapped in a few top atomic layers of the substrate surface (e.g., surfaces of the epitaxial layer 116, 118, gate dielectric 112, and/or dielectric material 110), without significantly damaging or etching the first doped silicon layer 116 or the substrate. Thereafter, a second plasma formed from a second chemistry may be used to eliminate loosely bound arsenic containing species on the front and backside surfaces of the substrate to further reduce outgassing towards the zero ppb level.

The plasma chamber may be any suitable chamber using plasma or plasma-assisted technology. In one implementation, operation 210 and operation 230 are performed in the same plasma chamber, such as the inductively coupled plasma chamber to be discussed below with respect to FIG. 3.

The outgassing control at operation 230 may include two sub-operations 230A and 230B. As will be discussed in more detail below, the sub-operation 230A may use a first low density plasma running in pulsing mode to remove a few atomic layers from exposed surfaces of the substrate without damaging crystal structure of the substrate. The sub-operation 230B may use a second low density pulsed plasma running in reverse mode at higher pressure to eliminate loosely bound species from the exposed surfaces of the substrate to further reduce outgassing towards the zero ppb level. The sequence of the sub-operations 230A and 230B may be reversed. In some implementations, the operation 230 may only include either one of the sub-operations 230A and 230B. Alternatively, either of the sub-operations 230A and 230B may be repeated.

At operation 230A, the outgassing control is performed in an inductively coupled plasma chamber by exposing the semiconductor structure 100 to a first etching process gas. The first etching process gas may include one or more etch precursors. In one implementation, the etch precursor includes a hydrogen-containing precursor, a chlorine-containing precursor, and an inert gas. The hydrogen-containing precursors may include atomic hydrogen (H), diatomic hydrogen ($H_2$), ammonia ($NH_3$), hydrocarbons, incompletely halogen-substituted hydrocarbons, combinations thereof, or the like. The chlorine-containing precursor may include chlorine gas ($Cl_2$) or chlorine trifluoride ($ClF_3$). The inert gas may include at least one of argon (Ar), helium (He), neon (Ne), xenon (Xe), nitrogen ($N_2$), and the like. In one example, the outgassing control involves the simultaneous exposure of a substrate to the plasma effluents of a diatomic hydrogen precursor, chlorine gas, and argon.

The term "precursor" in this disclosure is used to refer to any process gas, which takes part in a reaction to either remove material from or deposit material onto a surface. "Plasma effluents" are in an "excited state" wherein at least some of the gas molecules are in vibrationally-excited, dissociated and/or ionized states.

In some implementations, the substrate-processing region may consist essentially of $Cl_2$, hydrogen and an inert gas, $Cl_2$ and hydrogen, $Cl_2$ and an inert gas, or $Cl_2$, hydrogen and argon. The inclusion of the term "essentially" allows for other elemental concentrations, which may be unavoidably present in a typical processing system, as well as low concentrations, which do not adversely affect the outgassing process.

In either sub-operations 230A or 230B to be discussed below, the etch precursors may be delivered through precursor/gas inlets into a substrate processing region. In some implementations, the etch precursors may be mixed prior to introduction into the substrate processing region. In some implementations, the etch precursors may be introduced into the substrate processing regions separately. The etch precursors may be excited by an inductively coupled plasma created by applying alternating current (AC) power to one or more antenna coils. The plasma may be formed either in-situ or remotely.

In one implementation, a gas flow ratio (inert gas:hydrogen-containing precursor) may be between 1.5:1 and 50:1 (e.g., 1.5:1 to 3:1; 3:1 to 5:1; 5:1 to 10:1; 10:1 to 20:1; 20:1 to 30:1; 30:1 to 40:1; 40:1 to 50:1). A gas flow ratio (hydrogen-containing precursor:chlorine-containing precursor) may be between 0.6:1 and 10:1 (e.g., 0.6:1 to 0.8:1; 0.8:1 to 1.5:1; 1.5:1 to 3:1; 3:1 to 6:1; 6:1 to 8:1; 8:1 to 10:1). Flow rates and ratios of the different gases may be adjusted to control etch rates and etch selectivity.

For a 300 mm substrate, the hydrogen-containing precursor (e.g., $H_2$) may be supplied at a flow rate of between about 50 sccm (standard cubic centimeters per minute) and 800 sccm, such as about 100 sccm to about 300 sccm, for example about 200 sccm. The chlorine-containing precursor (e.g., $Cl_2$) may be supplied at a flow rate of between about 30 sccm and 600 sccm, such as about 50 sccm to about 300 sccm, for example about 250 sccm. The inert gas (e.g., Ar) may be supplied at a flow rate of between about 120 sccm and about 1000 sccm, such as about 200 sccm to about 450 sccm, for example about 300 sccm. One of ordinary skill in the art would recognize that other gases and/or flows may be used depending on a number of factors including processing chamber configuration, substrate size, geometry and layout of features, and the like.

During sub-operation 230A, the temperature of the substrate may be between about 0 degrees Celsius and about 80 degrees Celsius. In some implementations, the temperature of the substrate during the outgassing control may be greater than or about 20 degrees Celsius, greater than or about 30 degrees Celsius, greater than or about 40 degrees Celsius, greater than or about 50 degrees Celsius, greater than or about 60 degrees Celsius, greater than or about 70 degrees Celsius or greater than or about 80 degrees Celsius. In one example, the substrate temperature is about 50 degrees Celsius. The pressure within the plasma chamber may be between about 0.5 mTorr and about 200 mTorr, for example between about 2 mTorr and about 10 mTorr; between about 10 mTorr and about 20 mTorr; between about 20 mTorr and about 50 mTorr; between about 50 mTorr and about 80 mTorr; between about 80 mTorr and about 100 mTorr; between about 100 mTorr and about 120 mTorr; between about 120 mTorr and about 150 mTorr; between about 150 mTorr and about 180 mTorr; or between about 180 mTorr and about 200 mTorr.

Energy is applied to the inert gas, the hydrogen-containing precursor, and the chlorine-containing precursor while they are in the remote plasma region or the processing region to generate the plasma effluents. As would be appreciated by one of ordinary skill in the art, the plasma may include a number of charged and neutral species including radicals and ions. In cases where the plasma is generated using inductively coupled power, the plasma source power is inductively coupled into the remote plasma region or the processing region by a set of coil antennas, such as an inner coil antenna 340 and a middle coil antenna 350 shown in FIG. 3.

Figure 3:
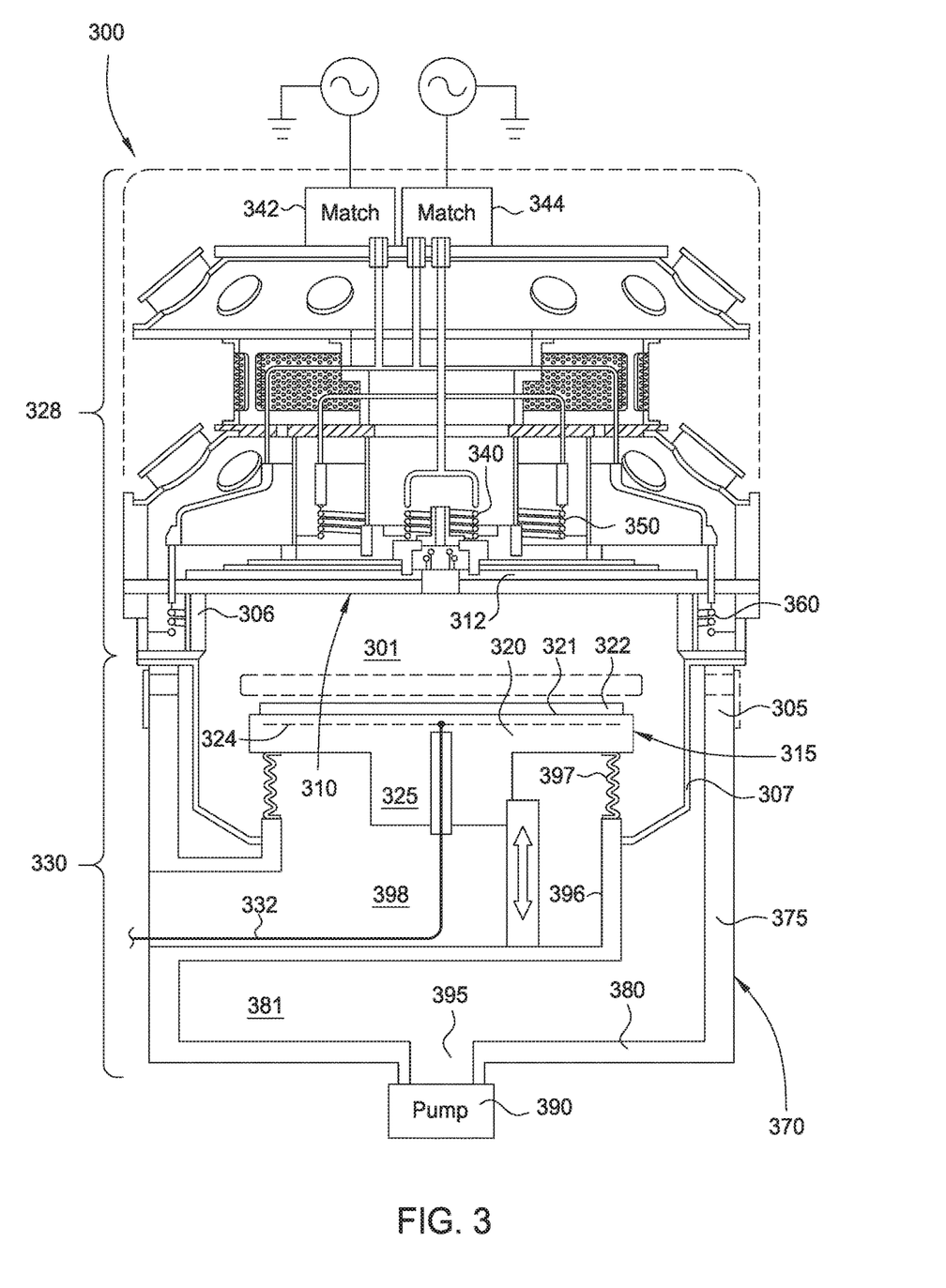
FIG. 3 depicts a cross-sectional view of one example of a processing chamber that may be used to perform the implementations described herein.

During sub-operation 230A, a low density plasma is used to remove only unwanted species that are absorbed or trapped in a few atomic layers of the substrate without significantly damaging the substrate (e.g., at a Si removal rate less than 0.5 atomic layer per minute). The inductively coupled plasma may use a pulsed source power operating in a standard mode (i.e., using the same RF frequency and the current flowed through the inner coil antenna 340 and the middle coil antenna 350 are in-phase). In one implementation, the source power may be between about 10 watts and about 2,500 watts (e.g., between about 50 watts and about 1,000 watts, between about 100 watts and about 800 watts; between about 200 watts and about 600 watts, or between about 300 watts and about 500 watts). The source power may be applied in a pulsed mode or a continuous mode. The RF frequency applied for may be low RF frequencies less than about 200 kHz, high RF frequencies between about 10 MHz and about 15 MHz, or microwave frequencies greater than or about 1 GHz in implementations.

In some implementation, an RF bias may be applied to the substrate via the substrate support with an RF power supply. Power applied to the substrate support creates a substrate bias in the form of a negative voltage on the upper surface of the substrate. This negative voltage is used to attract ions from the plasma formed in the processing region to the upper surface of the substrate. The RF bias may have a power level within a range from about 50 W to about 800 W. In one implementation, the RF bias may have a power level within a range from about 200 W to 400 W. For example, the RF bias may have a power level of 100 W, 200 W, 300 W, or 400 W. In some implementations, the frequency of the RF bias will be less than the frequency of the RF power source coupled to the coil antenna of the plasma chamber. For example, in some implementations, the RF bias frequency may be 2 MHz while the RF power source frequency may be 13.56 MHz. In another implementation, the RF bias frequency may be about 13.56 MHz and the RF power source frequency may be about 60 MHz.

While a low density plasma (e.g., $H_2/Cl_2/Ar$ plasma) is adapted to remove only a few top atomic layers of the substrate, the processing time of the outgassing at sub-operation 230A is controlled to prevent excessive etching of the substrate surface. The outgassing control may be performed for about 80 seconds or less, for example about 60 seconds or less, such as about 5 seconds to about 60 seconds, about 10 seconds to about 50 seconds, or about 20 seconds to about 40 seconds.

At operation 230B, the semiconductor structure 100 is exposed to a second etching process gas. Likewise, the second etching process gas may contain one or more etch precursors. In one implementation, the second etch precursor includes a hydrogen-containing precursor and an inert gas. The hydrogen-containing precursors and the inert gas may be similar to those used at operation 230A. In one example, the outgassing control involves the simultaneous exposure of a substrate to the plasma effluents of a diatomic hydrogen precursor and argon.

In one implementation, a gas flow ratio (inert gas:hydrogen-containing precursor) may be between 1.5:1 and 50:1 (e.g., 1.5:1 to 3:1; 3:1 to 5:1; 5:1 to 10:1; 10:1 to 20:1; 20:1 to 30:1; 30:1 to 40:1; 40:1 to 50:1). Flow rates and ratios of the different gases may be adjusted to control etch rates and etch selectivity. For a 300 mm substrate, the flow rate of the hydrogen-containing precursor (e.g., $H_2$) and the flow rate of the inert gas (e.g., Ar) may be similar to those discussed above at sub-operation 230A. One of ordinary skill in the art would recognize that other gases and/or flows may be used depending on a number of factors including processing chamber configuration, substrate size, geometry and layout of features, and the like. Likewise, the temperature of the substrate may be between about 0 degrees Celsius and about 80 degrees Celsius, such as those discussed above at sub-operation 230A.

The pressure within the plasma chamber may be higher than the pressure used at sub-operation 230A, such as between about 10 mTorr and about 700 mTorr, for example between about 10 mTorr and about 30 mTorr; between about 30 mTorr and about 60 mTorr; between about 60 mTorr and about 90 mTorr; between about 90 mTorr and about 120 mTorr; between about 120 mTorr and about 150 mTorr; between about 150 mTorr and about 180 mTorr; between about 180 mTorr and about 210 mTorr; between about 210 mTorr and about 250 mTorr; between about 250 mTorr and about 300 mTorr; between about 300 mTorr and about 350 mTorr; between about 350 mTorr and about 400 mTorr; between about 400 mTorr and about 450 mTorr; between about 450 mTorr and about 500 mTorr; between about 500 mTorr and about 550 mTorr; between about 550 mTorr and about 600 mTorr; between about 600 mTorr and about 650 mTorr; or between about 650 mTorr and about 700 mTorr.

During sub-operation 230B, a very low plasma density (about 10 to 50 times lower in density than the plasma used at sub-operation 230A) may be used to eliminate loosely bond species that are trapped on the exposed surface of the substrate without significantly damaging the substrate. Such a low density plasma may be achieved by operating the inductively coupled plasma in a reverse mode. That is, the current is flowed out of phase such that the first coil antenna (e.g., the inner coil antenna 340) has increased plasma density versus the second coil antenna (e.g., the middle coil antenna 350). This low density second plasma is much weaker than the first plasma used at sub-operation 230A even though RF power setting could be higher. As the second plasma is operated in a reverse mode instead of standard mode used in the first plasma, the net power is much lower. In one implementation, the plasma source power may be between about 10 watts and about 2,500 watts (e.g., between about 50 watts and about 1,000 watts, between about 100 watts and about 800 watts; between about 200 watts and about 600 watts, or between about 300 watts and about 500 watts). The plasma source power may be applied in a pulsed mode or a continuous mode. The RF frequency applied for either the local or remote plasmas described herein may be low RF frequencies less than about 200 kHz, high RF frequencies between about 10 MHz and about 15 MHz, or microwave frequencies greater than or about 1 GHz in implementations. In one exemplary example, the plasma is generated by a pulsed source power in reverse mode using RF frequency of 13.56 MHz applied with 20% duty cycle.

Similarly, a bias power may be applied to the semiconductor structure 100 or the substrate during the outgassing control, as discussed above at sub-operation 230A. The processing time of the outgassing at sub-operation 230B is controlled to prevent excessive etching of the substrate surface. The outgassing control may be performed for about 80 seconds or less, for example about 60 seconds or less, such as about 5 seconds to about 60 seconds, about 10 seconds to about 50 seconds, or about 20 seconds to about 40 seconds.

During sub-operations 230A and 230B, the semiconductor structure 100 may be elevated off the substrate support surface of the substrate support inside the plasma chamber (such as the substrate support 315) so that plasma can go around the substrate for better removal of arsenic containing species on the substrate front surface and the backside surface. The semiconductor structure 100 may be lifted above the substrate support surface by a lift pin extended through the substrate support 315 and above the substrate support surface to a desired height, such as about 1 mm to about 10 mm measuring from the substrate support surface 321.

The exposure of the substrate to a low density pulsed $H_2/Cl_2/Ar$ plasma (standard mode) followed by a low density pulsed $H_2/Ar$ plasma (reverse mode) that is 10 to 50 time less dance then the $H_2/Cl_2/Ar$ plasma in an inductively coupled plasma chamber allows for the outgassing of toxic gases, such as arsenic, to be reduced to safe levels. Particularly, the hydrogen radicals only react with arsenic-containing residuals or species ($AsH_x$ or TBA) absorbed or trapped on the top most of the substrate surface and turn them into volatile species, which evaporates quickly. The low plasma density and low energy ions remove majority of arsenic in a controlled manner (e.g., at a Si removal rate less than 0.5 atomic layer per minute) to appropriately abate the arsenic, while no noticeable surface damage is observed on the silicon surface. It has been observed that the silicon surface roughness is about 1.5 A after the integrated clean/recess and outgassing reduction process.

It is contemplated that sub-operations 230A and 230B may be repeated for at least one additional cycle after an initial completion of operation 230 so that outgassing is further driven down towards the zero ppb level. In some implementations, the operation 230 is repeated until outgassing levels drop to zero parts per billion. Testing has been completed and results indicate that exposure of a semiconductor structure in an inductively coupled plasma chamber after a Si:As/Si:P epitaxial process, outgassing is reduced to near zero ppb.

At operation 240, after sub-operations 230A and 230B (e.g., $H_2/Cl_2/Ar$ and $H_2/Ar$ plasma treatment), a weak $O_2/Ar$ plasma may be optionally formed in the plasma chamber, such as the plasma chamber described below with respect to FIG. 3, to oxidize the surface of the substrate, thereby forming an outgassing barrier 120 that seals at least a portion of a surface of the substrate, as shown in FIG. 1B. In one implementation where the first doped silicon layer 116 is a silicon layer doped with arsenic, the weak $O_2/Ar$ plasma oxidizes and forms the outgassing barrier 120 on the Si:As surface. The weak $O_2/Ar$ plasma may be formed by inductively coupling plasma in a reverse mode to the substrate processing region in the atmosphere of an oxygen-containing precursor and argon. In one implementation, a gas flow ratio (oxygen-containing precursor:argon) may be between 1:1 and 30:1 (e.g., 1:1 to 3:1; 3:1 to 5:1; 5:1 to 10:1; 10:1 to 20:1; 20:1 to 30:1). Flow rates and ratios of the different gases may be adjusted to control etch rates and etch selectivity. While oxygen is discussed here, it is contemplated that other oxygen-containing precursor, such as ozone (O3) gas, nitrous oxide (N2O), nitrogen monoxide, (NO), carbon monoxide (CO), carbon dioxide (CO2), water vapor (H2O), or any combination thereof, may also be used.

At operation 250, the substrates, which are essentially free of arsenic outgassing, may be transferred to a load-lock chamber or one or more processing chambers for further processing of the substrates, after outgassing control at operation 230, as will be discussed in FIG. 4. The plasma chamber may be cleaned at the same time for the next pre-epi clean.

FIG. 3 is a cross-sectional view of a plasma chamber 300 that may be used to practice implementations described herein. At least one of operation 210, operation 230, and operation 240 may be performed in the plasma chamber 300. The plasma chamber 300 depicted in FIG. 3 includes an upper portion 328 and a lower portion 330. The plasma chamber 300 has a sidewall 305 and a lid assembly 310. The sidewall 305 has an axially symmetrical shape, such as a cylinder. The sidewall 305 includes an axially symmetrical (e.g., cylindrical) dielectric side window 306 and a chamber liner 307, which may be formed of metal. A substrate support 315 inside the plasma chamber 300 includes a pedestal 320 having a substrate support surface 321 facing the lid assembly 310 for holding a substrate 322, and a post 325 supporting the pedestal 320. A processing region 301 of the plasma chamber 300 is confined by the lid assembly 310, the pedestal 320 and the sidewall 305. The pedestal 320 may include an insulated internal electrode 324. Optionally, an electrostatic chucking (ESC) voltage and/or RF plasma bias power may be supplied to the insulated internal electrode 324 via a cable 332 extending through the post 325. The cable 332 may be coupled to an RF bias power source (such as an RF impedance matching network and/or an RF power generator) as an RF bias feed to the insulated internal electrode 324. The cable 332 and may be provided as a coaxial transmission line, which may be rigid (or flexible), or as a flexible coaxial cable.

The plasma source power is inductively coupled into the processing region 301 by a set of coil antennas, including an inner coil antenna 340, a middle coil antenna 350 and optionally an outer or side coil antenna 360, all of which are concentrically disposed with respect to each other and are coaxial with the axis of symmetry of the sidewall 305. The lid assembly 310 includes a disk-shaped dielectric window through which the inner coil antenna 340 and the middle coil antenna 350 inductively couple RF plasma source power into the processing region 301. The disk-shaped dielectric window 312 is coaxial with the sidewall 305 and has a disk-plane parallel with the plane of the substrate support surface 321. The side coil antenna 360 inductively couples RF plasma source power into the processing region 301 through the cylindrical dielectric side window 306. The dielectric windows 306 and 312 may be referred to collectively as a window assembly.

The chamber liner 307 is enclosed within a lower chamber body 370 including a cylindrical lower chamber body sidewall 375 and a lower chamber body floor 380. The lower chamber body sidewall 375 and the lower chamber body floor 380 enclose an evacuation region 381. A vacuum pump 390 is disposed in a vacuum pump opening 395 in the lower chamber body floor 380 and is centered relative to the axis of symmetry of the lower chamber body sidewall 375. A containment wall 396 coaxial with the substrate support 315 and a flexible bellows 397 extending between the pedestal 320 and the containment wall 396 enclose the substrate support 315 in an internal central space 398. The internal central space 398 is isolated from the volume evacuated by the vacuum pump 390, including the evacuation region 381 and the processing region 301.

The power may be supplied from a common RF source or from different RF sources such as RF matches (RF impedance matching networks) 342 and 344. An RF impedance matching network may be employed having dual outputs in order to drive two of the coil antennas with a first RF generator, while a second RF generator and a second RF impedance matching network drives the third coil antenna. Alternatively, three RF generators may separately drive the three coil antennas through three respective RF impedance matching networks. In yet another implementation, a single RF power generator may drive all three-coil antennas through an RF impedance matching network having three outputs. In some implementations of the foregoing implementations, the RF power levels applied to the different coil antennas may be separately adjusted in order to control radial distribution of plasma ion density. While described implementations include the three coil antennas 340, 350 and 360, other implementations may include only one or two of the three described coil antennas 340, 350 and 360.

Figure 4:
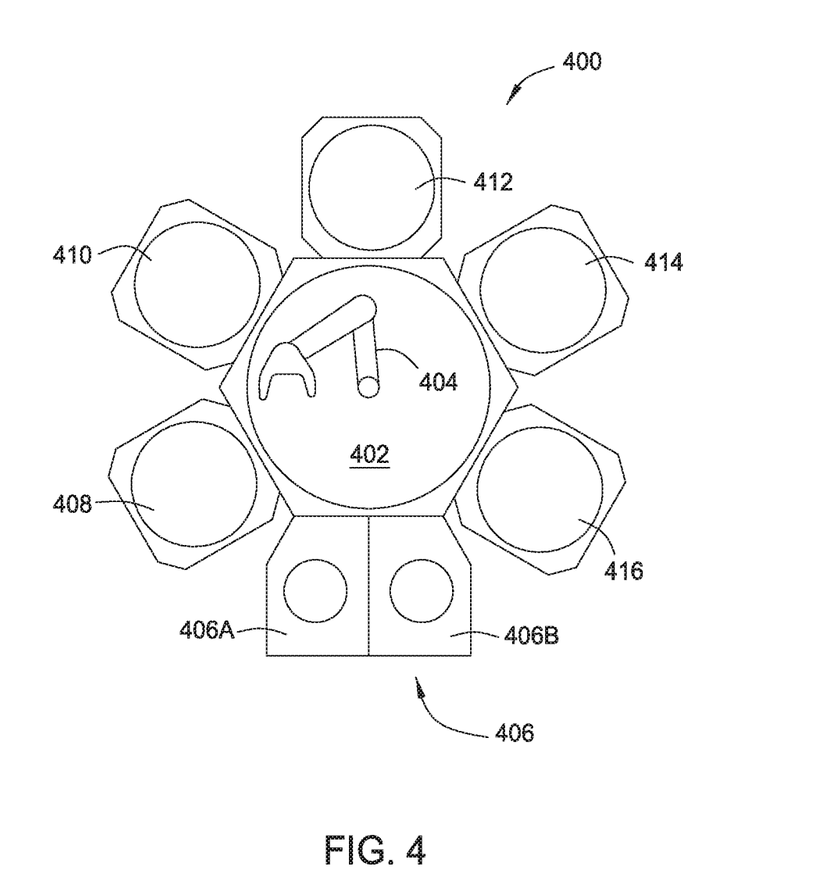
FIG. 4 depicts a schematic top view of a processing system that can be used to complete the processing sequence illustrated in FIG. 2 according to implementations described herein.

FIG. 4 is a schematic top view of a processing system that can be used to complete the processing sequence illustrated in FIG. 2 according to implementations described herein. One example of the processing system 400 is the CENTURA® system available from Applied Materials, Inc., of Santa Clara, Calif. A transfer robot 404 of any convenient type is disposed in a transfer chamber 402 of the processing system 400. A load-lock 406, with two load-lock chambers 406A, 406B is coupled to the transfer chamber 402. A plurality of processing chambers 408, 410, 412, 414, and 416 are also coupled to the transfer chamber 402. The plurality of processing chamber 408, 410, 412, 414, and 416 may include at least one of a cleaning chamber, an etching chamber, an oxidization chamber, and deposition chambers, such as an epitaxial deposition chamber.

Processing chamber 408 may be a plasma chamber configured to perform any of oxide removal (operation 210), outgassing control (operation 230), and the outgassing barrier formation (operation 240). The processing chamber 408 may be an inductively coupled plasma chamber similar to the plasma chamber 300 depicted in FIG. 3.

The processing chamber 416 may also be a plasma chamber configured to perform any of oxide removal (operation 210), outgassing control (operation 230), or the outgassing barrier formation (operation 240). The processing chamber 416 may be an inductively coupled plasma chamber similar to plasma chamber 300 depicted in FIG. 3. In some implementations, oxide removal (operation 210), outgassing control (operation 230), and the outgassing barrier formation (operation 240) are all performed in an inductively coupled plasma chamber such as processing chamber 408 or processing chamber 416. In one implementation, operation 210 and operation 230 are performed in processing chamber 408 and operation 240 is performed in processing chamber 416. Processing chambers 410, 412 and 414 may be a material deposition chamber such as an epitaxial deposition chamber capable of performing a selective epitaxial growth process (operation 220).

The processing system 400 may be used to perform the processing sequence 200 described above. During processing, a substrate that is to be processed may arrive to the processing system 400 in a pod (not shown). The substrate is transferred from the pod to the vacuum compatible load-lock 406A, 406B by the factory interface robot (not shown). The substrate is then handled by the transfer robot 404 in the transfer chamber 402, which is generally kept in a vacuum state. The transfer robot 404 then loads the substrate into either processing chamber 408 or processing chamber 416 for cleaning as described in operation 210. In implementations where operation 210 is performed in processing chamber 408, the transfer robot 404 then picks up the substrate from the processing chamber 408 and loads the substrate into the processing chambers 410, 412 and 414 for processing of the substrates, whichever is available, for material deposition. An epitaxial layer may be grown on the cleaned substrate in the processing chamber 410, 412 or 414 as described in operation 220. The transfer robot 404 then picks up the substrate from either of the processing chamber 410, 412 or 414 and loads the substrate into the processing chamber 408 or the processing chamber 416 for outgassing control as described in operation 230. Optionally, an outgassing barrier formation process may be performed in-situ as described in operation 240, or the transfer robot 404 may transfer the substrate to either the processing chamber 408 or the processing chamber 416 for outgassing barrier formation process. The transfer robot 404 then picks up the substrate from the processing chamber 408 or the processing chamber 416 and loads the substrate into the load-lock 406.

To summarize, the implementations disclosed herein relate to methods for controlling substrate outgassing such that hazardous gasses are eliminated from a surface of a substrate after a Si:As process has been performed on a substrate, and prior to additional processing. Some of the benefits of the present disclosure include improved cleaning of surfaces of a substrate in a plasma chamber prior to epitaxial deposition on the surface of the substrate. This improved cleaning of the substrate surface leads to an improvement of the quality of the subsequently formed epitaxial deposition layer. Further, arsenic-containing species trapped in the substrate surfaces and residual arsenic outgassing gasses are eliminated in the same plasma chamber before further processing, thereby reducing chamber footprint and associate costs.

While the foregoing is directed to implementations of the present disclosure, other and further implementations of the disclosure may be devised without departing from the basic scope thereof, and the scope thereof is determined by the claims that follow.

What is claimed is:

1. A method of processing a substrate, comprising:
   removing oxides from an exposed surface of a substrate in an inductively coupled plasma chamber;
   forming an epitaxial layer on the exposed surface of the substrate in an epitaxial deposition chamber; and
   performing an outgassing control of the substrate by:
      subjecting the substrate to a first plasma formed from a first etch precursor in the inductively coupled plasma chamber at a first chamber pressure, wherein the first etch precursor comprises a hydrogen-containing precursor, a chlorine-containing precursor, and an inert gas; and
      subjecting the substrate to a second plasma formed from a second etch precursor in the inductively coupled plasma chamber at a second chamber pressure that is higher than the first chamber pressure, wherein the second etch precursor comprises a hydrogen-containing precursor and an inert gas.

2. The method of claim 1, wherein the first plasma is a low density plasma running in standard mode.

3. The method of claim 2, wherein the first plasma is generated with a source power operating in pulsed mode.

4. The method of claim 1, wherein the second plasma is a low density plasma running in reverse mode.

5. The method of claim 4, wherein the second plasma is generated with a source power using RF frequency of 13.56 MHz applied with 20% duty cycle.

6. The method of claim 1, wherein the hydrogen-containing precursor comprises atomic hydrogen (H), diatomic hydrogen ($H_2$), ammonia ($NH_3$), hydrocarbons, incompletely halogen-substituted hydrocarbons, or any combinations thereof.

7. The method of claim 1, wherein the chlorine-containing precursor comprises chlorine gas ($Cl_2$) or chlorine trifluoride ($ClF_3$).

8. The method of claim 1, wherein the first etch precursor comprises $H_2$, $Cl_2$, and Ar, and the second etch precursor comprises $H_2$ and Ar.

9. The method of claim 1, wherein the hydrogen-containing precursor and the chlorine-containing precursor are flowed into the inductively coupled plasma chamber at a gas flow ratio (hydrogen-containing precursor:chlorine-containing precursor) of between 0.6:1 and 10:1.

10. The method of claim 1, wherein the inert gas and the hydrogen-containing precursor of the first and second etch precursors are flowed into the inductively coupled plasma chamber at a gas flow ratio (inert gas:hydrogen-containing precursor) of between 1.5:1 and 50:1.

11. The method of claim 1, wherein the first chamber pressure is between about 0.5 mTorr and about 200 mTorr, and the second chamber pressure is between about 10 mTorr and about 700 mTorr.

12. A method of processing a substrate, comprising:
   removing oxides from an exposed surface of a substrate in an inductively coupled plasma chamber;
   forming an epitaxial layer on the exposed surface of the substrate in an epitaxial deposition chamber; and
   performing an outgassing control of the substrate by:
      subjecting the substrate to a first plasma formed from a first etch precursor in the inductively coupled plasma chamber at a first chamber pressure, wherein the first etch precursor comprises a hydrogen-containing precursor, a chlorine-containing precursor, and an inert gas; and
      subjecting the substrate to a second plasma formed from a second etch precursor in the inductively coupled plasma chamber at a second chamber pressure that is higher than the first chamber pressure, wherein the second etch precursor comprises a hydrogen-containing precursor and an inert gas, and the second plasma is about 10 to 50 times lower in density than the first plasma.

13. The method of claim 12, further comprising:
   elevating the substrate off a substrate support surface of a substrate support disposed within the inductively coupled plasma chamber during the outgassing control, and the substrate is elevated at a distance of about 1 mm to about 10 mm from the substrate support surface.

14. The method of claim 12, further comprising:
   applying an RF bias to the substrate during the outgassing control; and
   subjecting the substrate to a $O_2$/Ar plasma to oxidize the exposed surface of the substrate, and the oxygen and argon are flowed into the inductively coupled plasma chamber at a flow ratio ($O_2$:Ar) of between 1:1 and 30:1.

15. A method of processing a substrate, comprising:
   transferring a substrate into a substrate processing region of a plasma chamber, wherein the substrate has an exposed silicon-containing surface;
   removing oxides from the exposed silicon-containing surface by use of a first plasma etch process, comprising:
      flowing a fluorine-containing precursor and an inert gas into the substrate processing region while applying a plasma power to form fluorine ions and inert gas ions; and
      etching the silicon-containing surface with the fluorine ions and the hydrogen-containing ions while applying a bias to the substrate to form an etched silicon-containing surface;
   transferring the substrate from the plasma chamber to an epitaxial deposition chamber;
   forming an epitaxial layer comprising arsenic on the exposed surface of the substrate;
   transferring the substrate from the epitaxial deposition chamber back to the plasma chamber; and
   performing an outgassing control of the substrate in the plasma chamber by:
      using a first plasma formed from a first etch precursor at a first chamber pressure to remove arsenic-containing species trapped on a few top atomic layers of the substrate without significantly etching the substrate, wherein the first etch precursor comprises a hydrogen-containing precursor, a chlorine-containing precursor, and an inert gas; and using a second plasma formed from a second etch precursor at a second chamber pressure that is higher than the first chamber pressure to eliminate loosely bond arsenic species from the exposed surfaces of the substrate, wherein the second etch precursor comprises a hydrogen-containing precursor and an inert gas.

16. The method of claim 15, wherein the second plasma is about 10 to 50 times lower in density than the first plasma.

17. The method of claim 15, wherein the first plasma is a low density plasma running in standard mode, and the second plasma is a low density plasma running in reverse mode.

18. The method of claim 15, wherein the first etch precursor comprises $H_2$, $Cl_2$, and Ar, and the second etch precursor comprises $H_2$ and Ar.

19. The method of claim 15, further comprising:

applying an RF bias to the substrate during the outgassing control; and subjecting the substrate to a $O_2$/Ar plasma to oxidize the exposed surface of the substrate.

* * * * *